United States Patent
Farmer et al.

(10) Patent No.: US 8,933,743 B1
(45) Date of Patent: Jan. 13, 2015

(54) SYSTEM AND METHOD FOR PRE-SKEWING TIMING OF DIFFERENTIAL SIGNALS

(71) Applicant: Avago Technologies General IP (Singapore) Pte. Ltd, Singapore (SG)

(72) Inventors: Michael M. Farmer, Fort Collins, CO (US); Robert Thelen, Fort Collins, CO (US); Thomas M. Walley, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/949,285

(22) Filed: Jul. 24, 2013

(51) Int. Cl.
*H03H 11/26* (2006.01)
*H03K 5/06* (2006.01)
*H03K 5/151* (2006.01)

(52) U.S. Cl.
CPC . *H03K 5/06* (2013.01); *H03K 5/151* (2013.01)
USPC .......................................... 327/270; 327/276

(58) Field of Classification Search
USPC ........................................................ 327/173
See application file for complete search history.

(56) References Cited

U.S. PATENT DOCUMENTS

| | | | |
|---|---|---|---|
| 7,937,605 B2 | 5/2011 | Rea et al. | |
| 2003/0034816 A1 * | 2/2003 | Oh ................................ | 327/162 |
| 2006/0098768 A1 | 5/2006 | Romero et al. | |
| 2008/0238516 A1 * | 10/2008 | Iorga ............................. | 327/287 |
| 2010/0085094 A1 * | 4/2010 | Ma ................................ | 327/158 |
| 2011/0163786 A1 * | 7/2011 | Ma ................................ | 327/153 |
| 2011/0234271 A1 * | 9/2011 | Kushnick ....................... | 327/156 |
| 2013/0127506 A1 * | 5/2013 | Kwak ............................ | 327/158 |
| 2013/0342248 A1 * | 12/2013 | Yang ............................. | 327/158 |
| 2013/0342249 A1 * | 12/2013 | Yang ............................. | 327/158 |
| 2013/0342251 A1 * | 12/2013 | Patel et al. .................... | 327/158 |
| 2014/0103985 A1 * | 4/2014 | Andreev et al. ............... | 327/262 |

OTHER PUBLICATIONS

Tektronix; High-speed Differential Data Signaling and Measurements; pp. 1-33; 2003.
National Semiconductor; DS90CR483 / DS90CR484 48-Bit LVDS Channel Link Serializer/Deserailizer; pp. 1-17; 2000.

* cited by examiner

*Primary Examiner* — Adam Houston

(57) ABSTRACT

A circuit for skewing differential signals includes a coarse adjustment stage configured to receive a differential input signal having a true component and a complement component, the coarse adjustment stage configured to impart a first controllable delay to at least one of the true component and the complement component of the differential signal, and a fine adjustment stage configured to impart a second controllable delay to at least one of the true component and the complement component of the differential signal, the second controllable delay having a resolution different than a resolution of the first controllable delay, the first controllable delay and the second controllable delay providing a timing skew between the true component and the complement component of the differential signal.

20 Claims, 7 Drawing Sheets

US 8,933,743 B1

SYSTEM AND METHOD FOR PRE-SKEWING TIMING OF DIFFERENTIAL SIGNALS

BACKGROUND

A modern integrated circuit (IC) must meet very stringent design and performance specifications. In many applications for communication devices, transmit and receive signals are exchanged over communication channels. These communication channels include impairments that affect the quality of the signal that traverses them. One type of IC that uses both a transmit element and a receive element is referred to as a serializer/deserializer (SERDES). The transmit element on a SERDES typically sends information to a receiver on a different SERDES over a communication channel. The communication channel is typically located on a different structure from where the SERDES is located.

The SERDES transmitter and the SERDES receiver communicate using differential signals. Differential signals are those that are represented by two complementary signals on different conductors, with the term "differential" representing the difference between the two complementary signals. The two complementary signals can be referred to as the "true" or "t" signal and the "complement" or "c" signal. All differential signals also have what is referred to as a "common mode," which represents the average of the two differential signals. High-speed differential signaling offers many advantages, such as low noise and low power while providing a robust and high-speed data transmission.

However, imperfections in the communication channel can cause mismatch between the two complementary signals. Minimizing this mismatch between the complementary signals can be done by independently adjusting the clock timing between the complementary signals at the transmitter or by using de-skewing circuitry in the receiver. Unfortunately, a skewed transmitter clocking scheme or de-skewing circuitry in the receiver are difficult to implement and are power intensive.

Therefore, it would be desirable to have a way to correct for the mismatch between the complementary signals in a differential signal communication methodology without using de-skewing circuitry in the receiver.

SUMMARY

In an embodiment, a circuit for skewing differential signals comprises a coarse adjustment stage configured to receive a differential input signal having a true component and a complement component, the coarse adjustment stage configured to impart a first controllable delay to at least one of the true component and the complement component of the differential signal, and a fine adjustment stage configured to impart a second controllable delay to at least one of the true component and the complement component of the differential signal, the second controllable delay having a resolution different than a resolution of the first controllable delay, the first controllable delay and the second controllable delay providing a timing skew between the true component and the complement component of the differential signal.

Other embodiments are also provided. Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

In an embodiment, the system and method for pre-skewing timing of differential signals is implemented in a serializer/deserializer (SERDES) transmitter. However, the system and method for pre-skewing timing of differential signals can be implemented in any circuitry that uses differential signals.

As used herein, the term "differential signal" refers to signals that are represented by two complementary signals on different conductors, with the term "differential" representing the difference between the two complementary signals. The two complementary signals can be referred to as the "true" or "t" signal and the "complement" or "c" signal.

Figure 1:
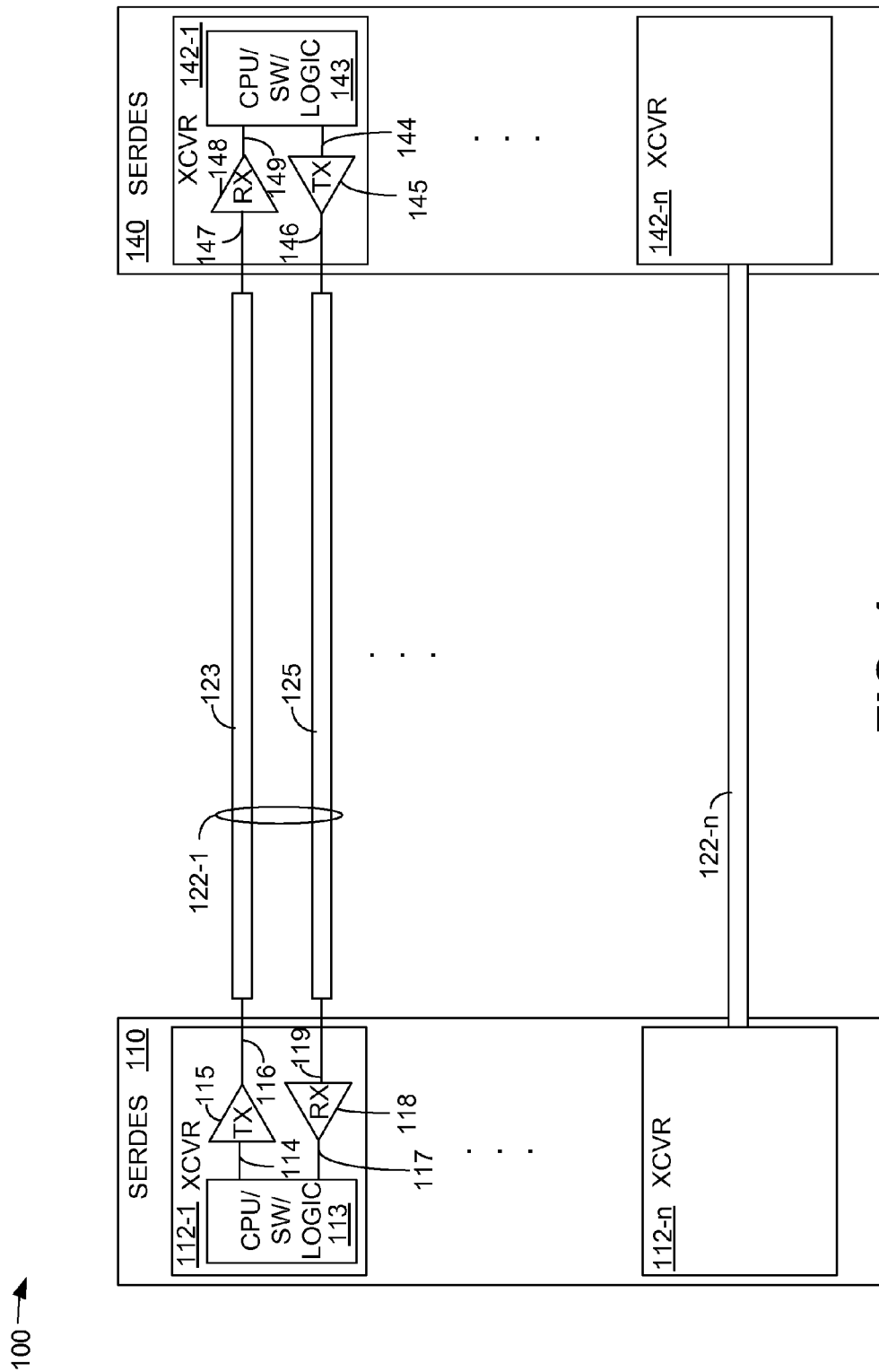
FIG. 1 is a schematic view illustrating an example of a communication system in which the pipelined programmable feed forward equalizer (FFE) for a receiver can be implemented.

FIG. 1 is a schematic view illustrating an example of a communication system 100 in which the system and method for pre-skewing timing of differential signals can be implemented. The communication system 100 is an example of one possible implementation. The communication system 100 comprises a serializer/deserializer (SERDES) 110 that includes a plurality of transceivers 112. Only one transceiver 112-1 is illustrated in detail, but it is understood that many transceivers 112-n can be included in the SERDES 110.

The transceiver 112-1 comprises a logic element 113, which includes the functionality of a central processor unit (CPU), software (SW) and general logic, and will be referred to as "logic" for simplicity. It should be noted that the depiction of the transceiver 112-1 is highly simplified and intended to illustrate only the basic components of a SERDES transceiver.

The transceiver 112-1 also comprises a transmitter 115 and a receiver 118. The transmitter 115 receives an information signal from the logic 113 over connection 114 and provides a transmit signal over connection 116. The receiver 118 receives an information signal over connection 119 and provides a processed information signal over connection 117 to the logic 113.

The system 100 also comprises a SERDES 140 that includes a plurality of transceivers 142. Only one transceiver 142-1 is illustrated in detail, but it is understood that many transceivers 142-n can be included in the SERDES 140.

The transceiver 142-1 comprises a logic element 143, which includes the functionality of a central processor unit (CPU), software (SW) and general logic, and will be referred to as "logic" for simplicity. It should be noted that the depiction of the transceiver 142-1 is highly simplified and intended to illustrate only the basic components of a SERDES transceiver.

The transceiver 142-1 also comprises a transmitter 145 and a receiver 148. The transmitter 145 receives an information signal from the logic 143 over connection 144 and provides a transmit signal over connection 146. The receiver 148 receives an information signal over connection 147 and provides a processed information signal over connection 149 to the logic 143.

The transceiver 112-1 is connected to the transceiver 142-1 over a communication channel 122-1. A similar communication channel 122-n connects the "n" transceiver 112-n to a corresponding "n" transceiver 142-n.

In an embodiment, the communication channel 122-1 can comprise communication paths 123 and 125. The communication path 123 can connect the transmitter 115 to the receiver 148 and the communication path 125 can connect the transmitter 145 to the receiver 118. The communication channel 122-1 can be adapted to a variety of communication methodologies including, but not limited to, single-ended, differential, or others, and can also be adapted to carry a variety of modulation methodologies including, for example, PAM 2, PAM 4 and others. In an embodiment, the receivers and transmitters operate on differential signals. Differential signals are those that are represented by two complementary signals on different conductors, with the term "differential" representing the difference between the two complementary signals. The two complementary signals can be referred to as the "true" or "t" signal and the "complement" or "c" signal. All differential signals also have what is referred to as a "common mode," which represents the average of the two differential signals. High-speed differential signaling offers many advantages, such as low noise and low power while providing a robust and high-speed data transmission.

Figure 2:
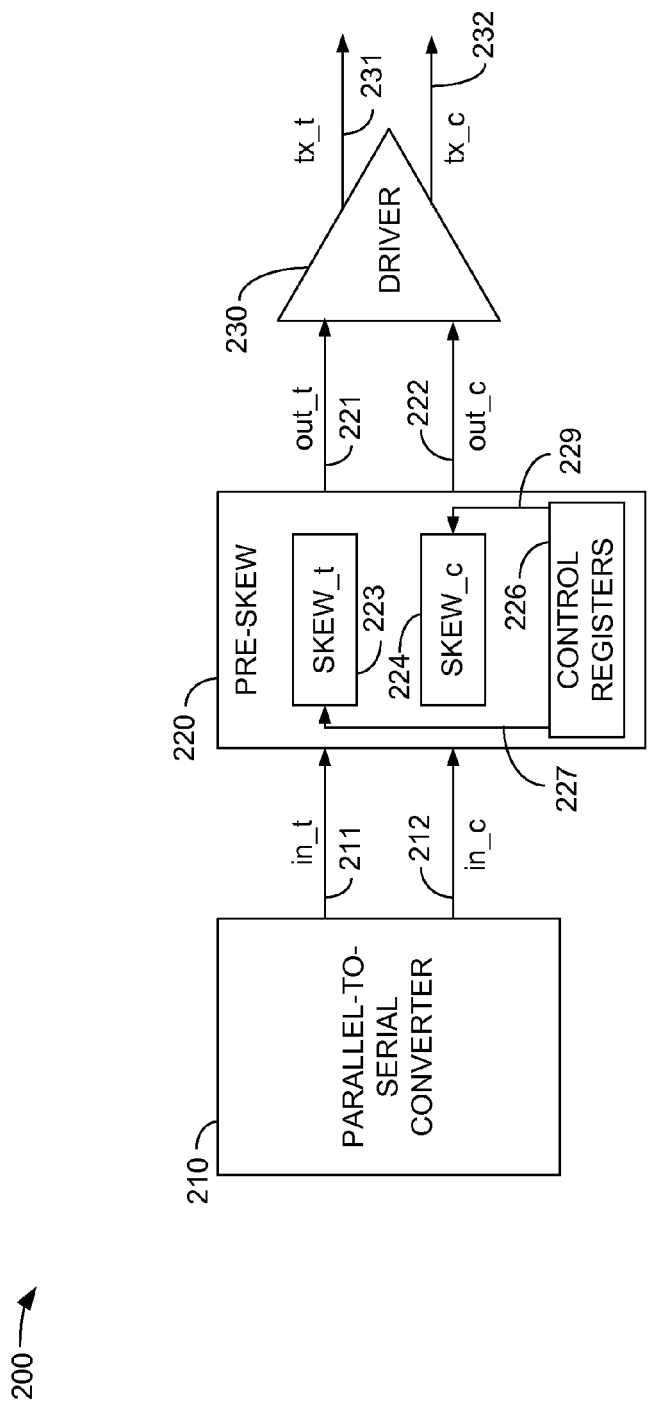
FIG. 2 is a schematic diagram illustrating an example of a portion of a transmitter of FIG. 1.

FIG. 2 is a schematic diagram illustrating an example of a portion of a transmitter of FIG. 1. The transmitter 200 can be a portion of any of the transmitters illustrated in FIG. 1. The transmitter 200 comprises a parallel-to-serial converter 210, a pre-skew circuit 220 and a driver 230. While illustrated as a single element, the driver 230 typically comprises a number of driver stages, with the driver 230 representing the final output stage. The parallel-to-serial converter 210 provides an input signal, "in_t" over connection 211 and an input signal, "in_c" over connection 212. The input signals in_t and in_c are the true and complement components of a differential signal.

The pre-skew circuit 220 comprises a circuit element 223 for providing a skew control to the in_t signal, and comprises a circuit element 224 for providing a skew control to the in_c signal. As used herein, the terms "skew" and "skew control" refer to creating a controllable and adjustable delay, or timing offset, between the in_t signal and the in_c signal. The controllable and adjustable delay can be provided to one or both of the in_t signal and the in_c signal.

A control register element 226 provides a control signal over connection 227 to the circuit element 223 and provides a control signal over connection 229 to the circuit element 224. The pre-skew circuit 220 provides an output signal, "out_t" over connection 221 and an output signal, "out_c" over connection 222. The output signals out_t and out_c are the true and complement signals of the differential signal on connections 211 and 212, but are skewed relative to each other by the circuit element 223 and/or the circuit element 224.

The output signal, out_t, over connection 221 and the output signal, out_c, over connection 222 are provided to a driver 230. The driver 230 amplifies the signals on connections 221 and 222 and provides a transmit signal, "tx_t" over connection 231 and a transmit signal "tx_c" over connection 232. The transmit signals tx_t and tx_c are the true and complement signals of the differential signal on connections 221 and 222.

The location of the pre-skew circuit 220 between the parallel-to-serial converter 210 and the driver 230 allows for a relatively simple implementation because it eliminates the need to maintain a highly accurate tight timing relationship between the system clock signal (not shown) and the differential data signal after the final serialization occurs in the parallel-to-serial converter 210.

Figure 3:
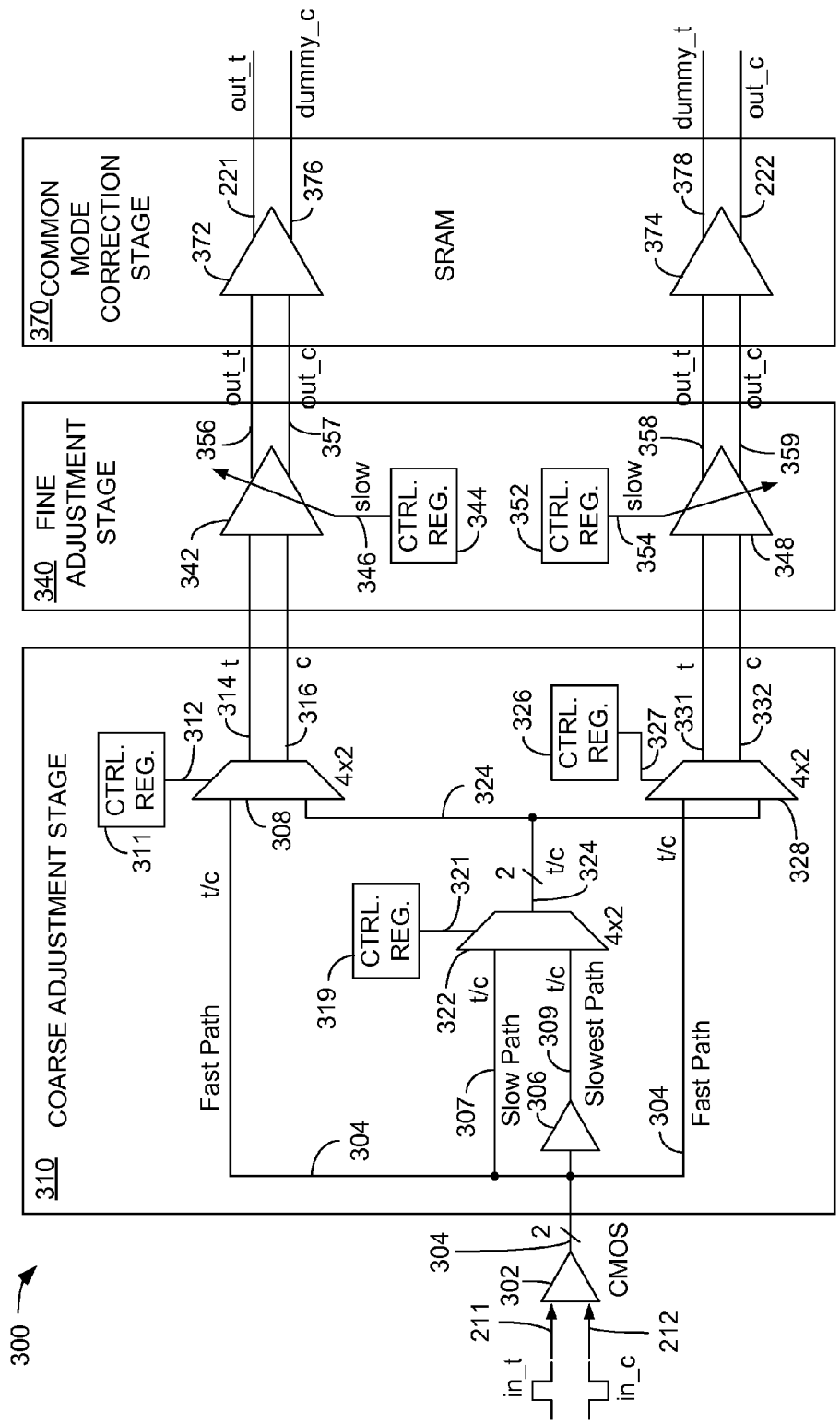
FIG. 3 is a block diagram illustrating an embodiment of the pre-skew circuit of FIG. 2.

FIG. 3 is a block diagram illustrating an embodiment of the pre-skew circuit of FIG. 2. The pre-skew circuit 300 comprises a coarse adjustment stage 310, a fine adjustment stage 340 and a common-mode correction stage 370.

The coarse adjustment stage 310 comprises multiplexers 308, 322 and 328, a buffer 306, a control register 311, a control register 319 and a control register 326.

The fine adjustment stage 340 comprises a buffer 342, a control register 344, a buffer 348 and a control register 352.

The common-mode correction stage 370 comprises a buffer 372 and a buffer 374.

The in_t and in_c input signals on connections 211 and 212, respectively, are provided to a buffer 302. The buffer 302 provides a complementary metal-oxide semiconductor (CMOS) level signal on connection 304. The signal on connection 304 is a buffered, two-bit signal representing both the in_t input signal and the in_c input signal.

The signal on connection 304 is provided to the multiplexer 308, the multiplexer 322 and the multiplexer 328. The signal on connection 304 is also provided to the buffer 306, the output of which on connection 309 is provided to the multiplexer 322. The output of the multiplexer 322 is controlled by the control register 319 over connection 321. The multiplexer 322 provides an output signal over connection 324. The signal on connection 324 comprises either the signal on connection 307 or the signal on connection 309, and is provided to the multiplexer 308 and to the multiplexer 328.

The output of the multiplexer 308 is controlled by the control register 311 over connection 312. The multiplexer 308 provides the in_t signal and the in_c signal over connections 314 and 316. However, in this embodiment, only the true component is of interest on connection 314 and only the complement component is of interest on connection 316.

The output of the multiplexer 328 is controlled by the control register 326 over connection 327. The multiplexer 328 provides the in_t signal and the in_c signal over connections 331 and 332. However, in this embodiment, only the true component is of interest on connection 331 and only the complement component is of interest on connection 332. The differential signals on connections 314 and 316, and the differential signals on connections 331 and 332 are referred to herein as "first intermediate" differential signals. The true component and the complement component of the first intermediate differential signal is on connections 314, 316, 331 and 332. However, on each of the connections 314, 316, 331 and 332, either the true component or the complement component of the first intermediate differential signal is considered to be "non-valid," a "duplicate" or a "dummy" signal and is present in the system, but not used.

The multiplexers 322, 308 and 328 are arranged in a cascaded format so that an adjustable and controllable coarse delay can be imparted to either or both of the in_t signal and the in_c signal. In this manner, the skew between the in_t signal and the in_c signal can be determined and adjusted by controlling the path of these signals through the coarse adjustment stage 310. For example, the buffer 306 provides a first delay to the signal on connection 304, the multiplexer 322 provides a second delay to the signal on connections 307 and 309, and the multiplexers 308 and 328 provide a third delay to the signals on connections 324. Accordingly, the signal on connection 304 encounters minimal delay and travels the "fastest" path through the coarse adjustment stage 310 because it is supplied directly to the multiplexers 308 and 328.

The signal on connection 307 encounters delay in addition to the delay encountered by the signal on connection 304 and travels the next "fastest" path, or the "slow path" because it traverses the multiplexer 322 before reaching the multiplexers 308 and/or 328.

The signal on connection 309 encounters delay in addition to the delay encountered by the signal on connection 307 and travels the "slowest" path because it first traverses the buffer 306 and the multiplexer 322 before reaching the multiplexers 308 and/or 328. In this manner, an adjustable and controllable delay can be imparted to the input signals in_t and in_c depending on the signals' route through the coarse adjustment stage 310. In an embodiment, one of the signals, in_t or in_c, is delayed while the other is undelayed, or held at a minimum delay, for example, the signal on the connection 304, creating a controllable net skew between the differential signals in_t and in_c. The control registers 311, 319 and 326 select an input to each respective multiplexer 308, 322 and 328, thereby determining the coarse delay for either the true or complimentary signals. If no skew is desired, minimum delays for both signals are selected by the control registers 311, 319 and 326, thus selecting the fastest path on connection 304 through the multiplexers 308 and 328.

The first intermediate differential signals on connections 314 and 316 comprise both the true component and the complement component, but, in this example, only the true component is of interest on connection 314 and only the complement component is of interest on connection 316. The true signal on connection 314 and the complement signal on connection 316 are provided to a first buffer 342 in the fine adjustment stage 340. The first intermediate differential signals on connections 331 and 332 comprise both the true component and the complement component, but, in this example, only the true component is of interest on connection 331 and only the complement component is of interest on connection 332. The true signal on connection 331 and the complement signal on connection 332 are provided to a second buffer 348 in the fine adjustment stage 340.

The first buffer 342 receives a control signal over connection 346 from a control register 344 and the second buffer 348 receives a control signal over connection 354 from a control register 352. The first buffer 342 and the second buffer 348 can be implemented to provide additional delay to the first intermediate differential signals on connections 314 and 316, and on connections 331 and 332.

The buffers 342 and 348 can be controlled by the control registers 344 and 352, respectively, to independently slow the transitions of the signals on connections 314 and 316, or on connections 331 and 332. The signals on connections 314 and 316 will have matched delays and the signals on connections 331 and 331 will have matched delays. However, the delay applied by the buffer 342 is independent of the delay applied by the buffer 348. One way to slow the signal transitions is to impart a small amount of feedback, as will be described below in FIG. 6. Other ways to slow the signal transitions include switching in capacitance or weakening a portion of the signal path. However, it is desirable to minimize Inter-Symbol Interference (ISI) applied to the signals. If the signals are not fully saturated in one (1) unit interval (UI) of the system clock, such as a CMOS signal that does not reach the supply or ground rail, then ISI may become a significant limiting factor in the system's signal integrity. A time period, referred to as a unit interval (UI) generally corresponds to a time period of one clock cycle of the system clock. For example, a transceiver could be communicating at 50 Gbps, using PAM4, the baud rate is 25 G baud per second, and one UI would be 40 ps=1/25 G.

The buffers 342 and 348 are independently controlled as to allow one buffer to enable additional skew while the other buffer passes data through without any additional delay. The differential signals on connections 356 and 357, and the differential signals on connections 358 and 359 are referred to herein as the output signals, with the "out_t" signal being of interest on connections 356 and 358 and the "out_c" signal being of interest on connections 357 and 359. In this example, the true component of the output signal is on connection 356 and on connection 358, while the complement component of the output signal is on connection 357 and 359.

In an embodiment, the delay adjustment provided by the fine adjustment stage 340 can be half of the minimum adjustment capable of being provided by the coarse adjustment stage 310. In this example, the minimum adjustment through the coarse adjustment stage 310 is the delay through the multiplexer 322. The buffer 306 can be designed to have a delay of the same magnitude as the multiplexer 322. This will yield a solution that can have equally spaced delay adjustments and will be monotonic given an increasing register code from the control registers. For example, if the coarse adjustment stage 310 can delay one of the data edges by 0, 8 picoseconds (ps), 16 ps, or 24 ps, having the succeeding fine adjustment stage 340 that can delay 0, or 4 ps, provides the ability to delay the data by 0, 4 ps, 8 ps, 12 ps, 16 ps, 20 ps, 24 ps and 28 ps, thus providing a wide adjustment range.

The common-mode correction stage 370 uses the "non-valid," "dummy" or "duplicate" complement signal alongside each of the original differential signal components to correct, or diminish, the common mode. The "non-valid," "dummy" or "duplicate" signals are skewed exactly as the original signal. The non-valid, dummy, or duplicate, signal drives into a static random access memory (SRAM)-like structure to equalize the rise and fall times for the output signals on connections 356/357 and 358/359. An ideal common mode signal for differential signaling is constant and midway between a high and low value. The common mode of a differential pair is defined as (true+compliment)/2. Temporary deviation from the average is referred to as common mode noise, which can cause signal cross-talk, is detrimental to the signal integrity of the system and can couple into adjacent SERDES channels or other signaling in close proximity. Transitioning signals through almost any circuit is likely to alter the ratio of rise to fall times and alter the time that a signal is consider high or low. The result is common mode noise. By placing a SRAM structure across the output of two inverters with complementary inputs, a drive fight occurs slowing down the leading signal and causing a correction to the effective common mode of the two inputs.

The output of the buffer 342 is provided over connections 356 and 357 to the buffer 372. The output of the buffer 348 on connections 358 and 359 is provided to the buffer 374.

In an embodiment, the buffer 372 provides the out_t signal on connection 221 and provides a "dummy" or "duplicate" complement signal, dummy_c or duplicate_c, on connection 376. In an embodiment, the buffer 374 provides the out_c signal on connection 222 and provides a "dummy" or "duplicate" true signal, dummy_t or duplicate_t, on connection 378.

The pre-skew circuit 300 can compensate for transmission channel irregularities, such as, for example, circuit board manufacturing irregularities, transmission channel impairments, etc. Moreover, the pre-skew circuit 300 minimally affects ISI and common-mode distortion.

Figure 4:
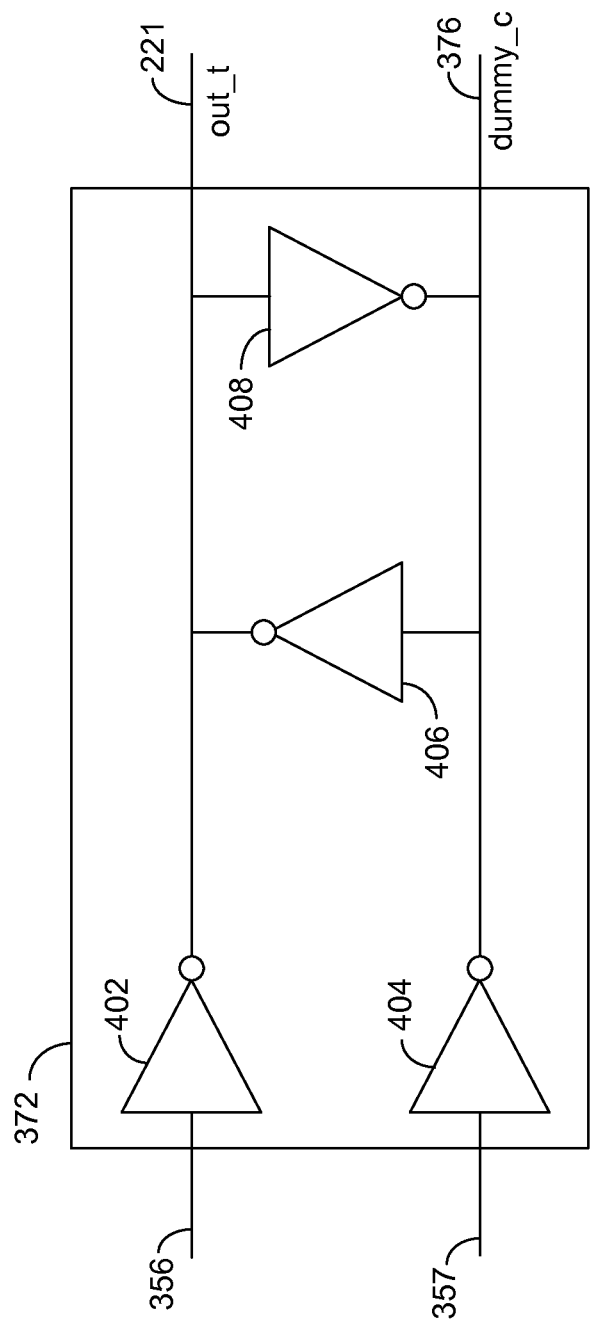
FIG. 4 is a schematic diagram illustrating the common mode correction stage of FIG. 3 in greater detail.

FIG. 4 is a schematic diagram illustrating the common mode correction stage of FIG. 3 in greater detail. FIG. 4 shows the buffer 372 of FIG. 3 in greater detail. Although not shown in FIG. 4, the buffer 374 of FIG. 3 can be implemented in a manner similar to the buffer 372 to provide common mode correction for the signals on connections 358 and 359.

In an embodiment, the buffer 372 comprises inverters 402, 404, 406 and 408. The inverter 402 receives the out_t signal over connection 356 and the inverter 404 receives the out_c signal over connection 357. By placing a SRAM structure comprising the inverters 406 and 408 across the output of the inverters 402 and 404 having complementary inputs, a drive fight occurs slowing down the leading signal and causing a correction to the effective common mode of the two signals, thus providing a differential output on connections 221 and 376 having a corrected common mode.

Figure 5:
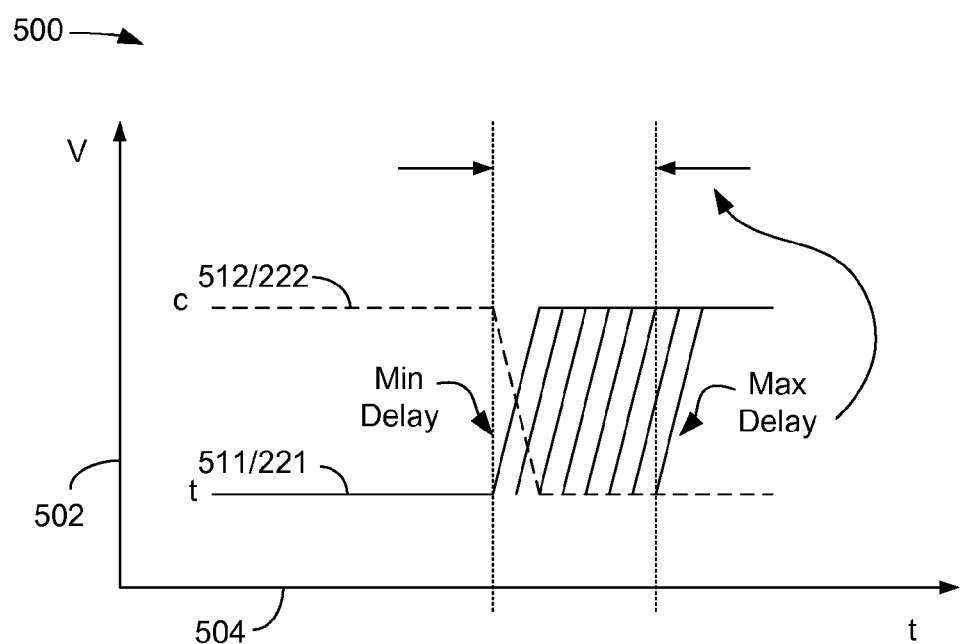
FIG. 5 is a graphical illustration showing relative timing skew between the two components of a differential signal.

FIG. 5 is a graphical illustration 500 showing relative timing skew between the two components of a differential signal. The example of FIG. 5 shows a composite illustration of possible skews between a true ("t") component 511 of a differential signal and a complementary ("c") component 512 of a differential signal. The "t" signal 511 corresponds to the signal 221 (FIG. 3) and the "c" signal 512 corresponds to the signal 22 (FIG. 3). The range of possible skews illustrated between the signal 511 and the signal 512 is created by selection of different register codes at the output of both the coarse adjustment stage 310 and the fine adjustment stage 340.

The vertical axis 502 represents normalized voltage and the horizontal axis 504 represents time. In the example shown in FIG. 5, a range of possible delays is shown for the true component 511 relative to the complement component 512, with the delay being an adjustable amount determined by the path of the t and c signal through the coarse adjustment stage 310 (FIG. 3) and the fine adjustment stage 340 (FIG. 3). In an embodiment, the pre-skew circuit 300 can provide an adjustable delay on the order of one (1) to tens of picoseconds between the t signal and the c signal.

Figure 6:
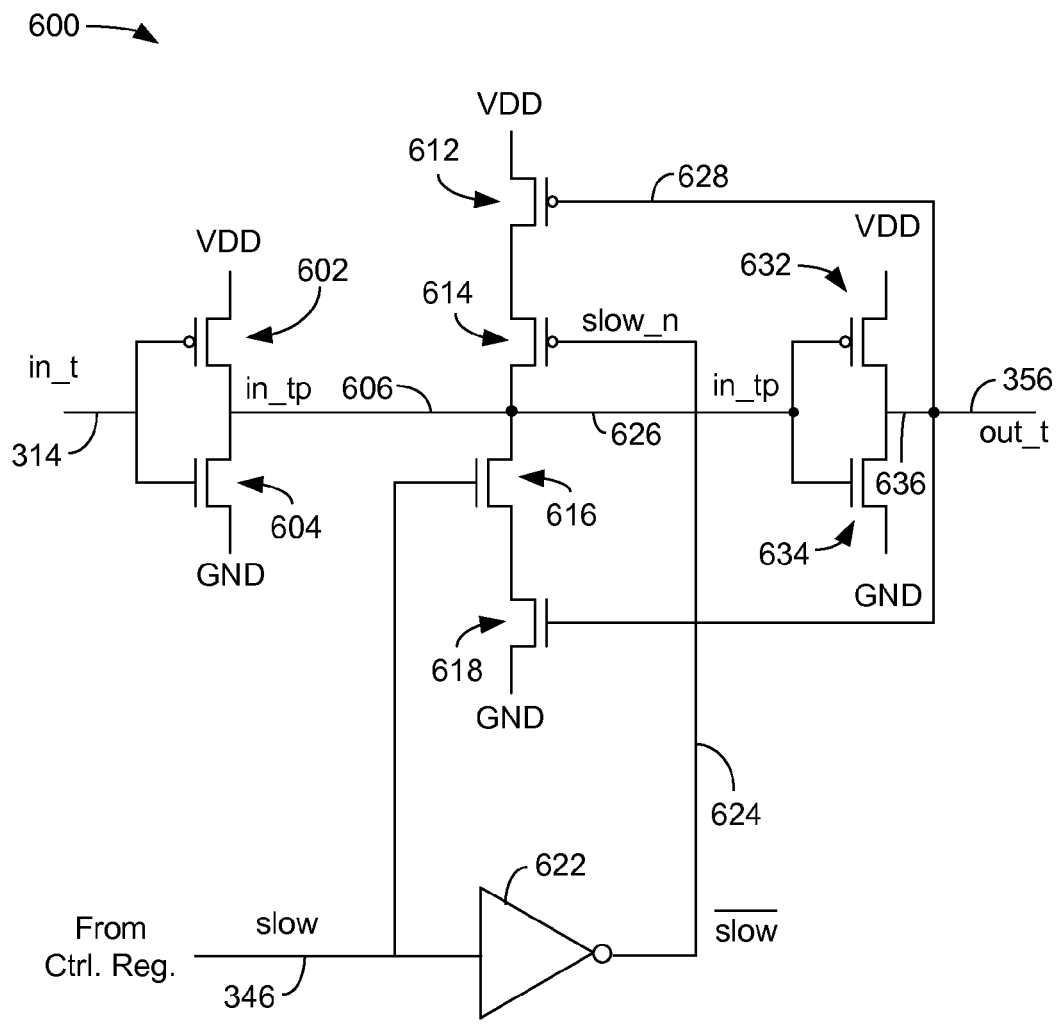
FIG. 6 is a schematic diagram showing an example of a circuit that can be used to slow the signal transitions as provided by the buffer of FIG. 3.

FIG. 6 is a schematic diagram 600 showing an example of a circuit that can be used to slow the signal transitions as provided by the buffer 342 or 348 of FIG. 3. The circuit 600 comprises one-half of either the buffer 342 or the buffer 348 of FIG. 3. A complete implementation of the fine adjustment stage 340 (FIG. 3) would use four of the circuits 600 of FIG. 6 to fully implement the buffers 342 and 348 of FIG. 3. The circuit 600 is described using field effect transistor (FET) components, but can be implemented using any switching technology. The value of the voltage, VDD, and the value of ground, GND, depends on the implementation and on the switching technology.

The circuit 600 comprises a first stage comprising transistors 602 and 604, a second stage comprising transistors 612, 614, 616 and 618, and a third stage comprising transistors 632 and 634. The circuit 600 also comprises an inverting buffer 622 configured to receive the control signal over connection 346 from the control register 344 (FIG. 3).

The "true" component of the first intermediate differential signal is provided over connection 314 to the gates of the transistors 602 and 604. The signal on connection 606 is referred to as the "in_tp" signal (and is provided to the gates of the transistors 632 and 634. The signal "in_tp" is an inverted and delayed version of the signal "in_t."

The control signal on connection 346 is provided to the gate of the transistor 616 and to the inverting buffer 622. The output of the inverting buffer 622 is provided over connection 624 to the gate of the transistor 614 and is referred to as the "slow_n" signal. The signal on connection 624 is generated by control logic (not shown) that establishes a feedback path created by transistor 612 and transistor 618. Turning off the transistors 614 and 616 via the control signal "slow" and its complement on connection 624 increases the propagation speed of the signal "in_t" through this variable delay buffer.

The gate of the transistor 612 is connected to the gate of the transistor 618 over connection 628. The output of the circuit 600 is taken from the connection 636 and is provided as the true output signal "out_t" over connection 356.

Figure 7:
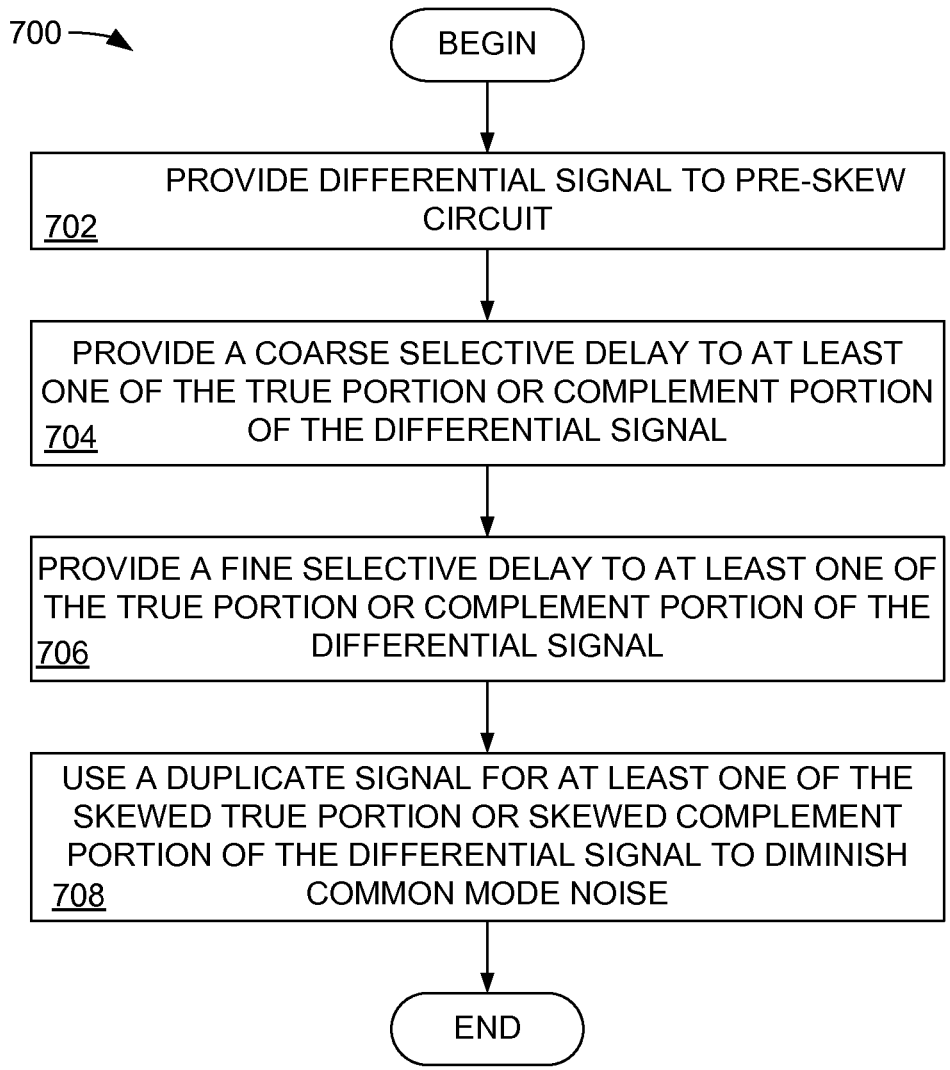
FIG. 7 is a flow chart describing the operation of an embodiment of a method for pre-skewing timing of differential signals.

FIG. 7 is a flow chart describing the operation of an embodiment of a method for pre-skewing timing of differential signals.

In block 702, a differential signal is provided to the pre-skew circuit 300.

In block 704, a coarse selective delay is provided to at least one of the true component or the complement component of the differential signal.

In block 706, a fine selective delay is provided to at least one of the true component or the complement component of the differential signal.

In block 708, duplicate signals for either or both of the true component and the complement component of the differential signal are used to diminish common mode noise.

This disclosure describes the invention in detail using illustrative embodiments. However, it is to be understood that the invention defined by the appended claims is not limited to the precise embodiments described.

What is claimed is:

1. A circuit for skewing differential signals, comprising:
a coarse adjustment stage configured to receive a differential input signal having a true component and a complement component, the coarse adjustment stage configured to impart a first controllable delay to at least one of the true component and the complement component of the differential signal; and
a fine adjustment stage configured to impart a second controllable delay to at least one of the true component and the complement component of the differential signal, the second controllable delay having a resolution different than a resolution of the first controllable delay, the first controllable delay and the second controllable delay providing a timing skew between the true component and the complement component of the differential signal.

2. The circuit of claim 1, further comprising a common-mode correction stage configured to use a duplicate signal for at least one of the true component and the complement component to diminish common mode noise.

3. The circuit of claim 2, wherein the circuit is located between a parallel-to-serial converter and a transmit driver.

4. The circuit of claim 2, wherein the timing skew between the true component and the complement component of the differential signal ranges from one (1) to tens of picoseconds.

5. The circuit of claim 2, wherein the coarse adjustment stage comprises a plurality of selectable delay paths and the first controllable delay is determined by a selected delay path.

6. The circuit of claim 2, wherein the fine adjustment stage comprises logic configured to slow transitions of any of the true component and the complement component of the differential signal.

7. The circuit of claim 2, wherein the common mode correction stage comprises first inverters located across an output of second inverters, the second inverters having as inputs the true component and the complement component of the differential signal.

8. A method for skewing differential signals, comprising:
receiving a differential input signal having a true component and a complement component;
imparting a first controllable delay to at least one of the true component and the complement component of the differential signal; and
imparting a second controllable delay to at least one of the true component and the complement component of the differential signal, the second controllable delay having a resolution different than a resolution of the first controllable delay, the first controllable delay and the second controllable delay providing a timing skew between the true component and the complement component of the differential signal.

9. The method of claim 8, further comprising using a duplicate signal for at least one of the true component and the complement component to diminish common mode noise.

10. The method of claim 9, wherein the first controllable delay and the second controllable delay is provided between a parallel-to-serial converter and a transmit driver.

11. The method of claim 9, wherein the timing skew between the true component and the complement component of the differential signal ranges from one (1) to tens of picoseconds.

12. The method of claim 9, wherein the first controllable delay is implemented by a plurality of selectable delay paths and the first controllable delay is determined by a selected delay path.

13. The method of claim 9, wherein the second controllable delay is implemented by slowing transitions of any of the true component and the complement component of the differential signal.

14. A transmitter, comprising:
a parallel-to-serial converter;
a pre-skew circuit having:
a coarse adjustment stage configured to receive a differential input signal having a true component and a complement component, the coarse adjustment stage configured to impart a first controllable delay to at least one of the true component and the complement component of the differential signal; and
a fine adjustment stage configured to impart a second controllable delay to at least one of the true component and the complement component of the differential signal, the second controllable delay having a resolution different than a resolution of the first controllable delay, the first controllable delay and the second controllable delay providing a timing skew between the true component and the complement component of the differential signal; and a transmit driver configured to receive the output of the pre-skew circuit.

15. The transmitter of claim 14, further comprising a common-mode correction stage configured to use a duplicate signal for at least one of the true component and the complement component to diminish common mode noise.

16. The transmitter of claim 15, wherein the pre-skew circuit is located between a parallel-to-serial converter and a transmit driver.

17. The transmitter of claim 15, wherein the timing skew between the true component and the complement component of the differential signal ranges from one (1) to tens of picoseconds.

18. The transmitter of claim 15, wherein the coarse adjustment stage comprises a plurality of selectable delay paths and the first controllable delay is determined by a selected delay path.

19. The transmitter of claim 15, wherein the fine adjustment stage comprises logic configured to slow transitions of any of the true component and the complement component of the differential signal.

20. The transmitter of claim 15, wherein the common mode correction stage comprises first inverters located across an output of second inverters, the second inverters having as inputs the true component and the complement component of the differential signal.

* * * * *